(12) United States Patent
Wu

(10) Patent No.: US 10,297,498 B2
(45) Date of Patent: May 21, 2019

(54) METHOD FOR PREPARING CERAMIC PACKAGE SUBSTRATE WITH COPPER-PLATED DAM

(71) Applicant: DONGGUAN CHINA ADVANCED CERAMIC TECHNOLOGY CO., LTD, Guangdong (CN)

(72) Inventor: Zhaohui Wu, Guangdong (CN)

(73) Assignee: DONGGUAN CHINA ADVANCED CERAMIC TECHNOLOGY CO., LTD., Dongguan, Guangdong (CN)

( * ) Notice: Subject to any disclaimer, the term of this patent is extended or adjusted under 35 U.S.C. 154(b) by 0 days.

(21) Appl. No.: 15/744,833

(22) PCT Filed: Dec. 7, 2016

(86) PCT No.: PCT/CN2016/108770
§ 371 (c)(1),
(2) Date: Jan. 15, 2018

(87) PCT Pub. No.: WO2018/102998
PCT Pub. Date: Jun. 14, 2018

(65) Prior Publication Data
US 2019/0013239 A1  Jan. 10, 2019

(51) Int. Cl.
| | | |
|---|---|---|
| *H01L 21/768* | (2006.01) | |
| *H01L 21/70* | (2006.01) | |
| *H01L 21/203* | (2006.01) | |
| *H01L 21/48* | (2006.01) | |
| *H01L 21/3213* | (2006.01) | |
| *H01L 23/15* | (2006.01) | |
| *H01L 23/49* | (2006.01) | |

(52) U.S. Cl.
CPC ...... *H01L 21/76873* (2013.01); *H01L 21/203* (2013.01); *H01L 21/3213* (2013.01); *H01L 21/48* (2013.01); *H01L 21/4846* (2013.01); *H01L 21/707* (2013.01); *H01L 23/15* (2013.01); *H01L 23/49* (2013.01)

(58) Field of Classification Search
None
See application file for complete search history.

(56) References Cited

U.S. PATENT DOCUMENTS

| | | | | |
|---|---|---|---|---|
| 2005/0095438 A1* | 5/2005 | Kim | ........................ | H01L 21/50 428/432 |
| 2005/0139990 A1* | 6/2005 | Kim | ........................ | H01L 21/50 257/704 |
| 2008/0087986 A1* | 4/2008 | Tanikella | ............ | H01L 21/4857 257/643 |

(Continued)

*Primary Examiner* — Alexander G Ghyka
(74) *Attorney, Agent, or Firm* — Leong C. Lei

(57) ABSTRACT

A method for preparing a ceramic package substrate with a copper-plated dam involves making a circuit layer on a ceramic base by performing thin film metallization, dry film application, exposure, development, copper plating, and evening, and then forming copper-plated dams that circle individual circuits by repeatedly applying dry film application, exposure, development, and electroplating for thickening, so as to obtain the ceramic package substrate with the copper-plated dam. Circuits made using the method feature for high dimensional precision, high line resolution, and high surface evenness.

7 Claims, 9 Drawing Sheets

(56) References Cited

U.S. PATENT DOCUMENTS

| | | | |
|---|---|---|---|
| 2014/0061669 A1* | 3/2014 | Otremba | H01L 23/142 257/77 |
| 2014/0160688 A1* | 6/2014 | Lu | H01L 23/49816 361/728 |
| 2014/0201993 A1* | 7/2014 | Nakayama | B24C 3/322 29/846 |
| 2016/0268995 A1* | 9/2016 | Hasegawa | H03H 9/0552 |
| 2019/0019740 A1* | 1/2019 | Wu | H01L 21/481 |
| 2019/0043797 A1* | 2/2019 | Tan | H01L 23/49838 |

* cited by examiner

METHOD FOR PREPARING CERAMIC PACKAGE SUBSTRATE WITH COPPER-PLATED DAM

BACKGROUND OF THE INVENTION

1. Technical Field

The present invention relates to microelectronic packaging, and more particularly to a method for preparing a ceramic package substrate with a copper-plated dam.

2. Description of Related Art

Currently, optoelectronic devices expected to having high airtightness and reliability in terms of package, such as sensors, crystal oscillators, resonators, power semiconductors, and lasers, usually use ceramic substrate package, which is typically structured by building a metal dam on a ceramic base having a circuit layer, so that the metal dam and the ceramic base jointly define a sealed chamber for containing a chip, being filled with encapsulant or inert gas, or being directly vacuumed, thereby achieving airtight package with high reliability.

Circuits are made on the base of a ceramic substrate using thick-film silk screening, and vias in circuit layers on upper and lower surfaces of the base have been filled with metal slurry using silk screening injection. Afterward, metal dams are fixed to the ceramic base through soldering or binding. However, the existing ceramic substrate package has some defects. First, the circuits made using thick-film silk screening are inferior in line resolution and alignment accuracy, and have rough surfaces, which are unfavorable to die bonding on chips, making it go against the trend toward microminiaturization. Second, vias filled using silk screening injection have gaps, which adversely affect the device's reliability in terms of electric connection. Third, where the metal dams are fixed to the ceramic base using soldering, air gaps tend to appear in the soldering layer and lead to degraded airtightness. Besides, thermal stress generated during high-temperature soldering can bring about warpage and deformation to the substrate, and reduce reliability and airtightness, and in turn the yield of the final substrate. Fourth, where the metal dams are affixed using an organic binder, combination of the dams and the ceramic substrate is less firm and air bubbles are likely to appear, thereby degrading airtightness of package. In addition, when being subject to illumination (particularly ultraviolet) and heat, the organic binder tends to age and lose its binding ability prematurely, thus imperiling the substrate's reliability.

SUMMARY OF THE INVENTION

In view of this, the primary objective of the present invention is to address the shortcomings of the prior art by providing a method for preparing a ceramic package substrate with a copper-plated dam, which can effectively solve the problems about rough substrate circuits, low resolution, poor via filling, and low reliability and airtight related to known soldering and binding dams.

To achieve the foregoing objective, the present invention adopts the following technical schemes:

A method for preparing a ceramic package substrate with a copper-plated dam comprises the following steps:

(1) performing thin film metallization: performing thin film metallization on a surface of a ceramic board;

(2) making individual circuits and circular copper-plated parapets on a ceramic base: performing dry film application, exposure, development, and copper plating successively on the metalized surface of the ceramic board, so as to obtain a ceramic base carrying a plurality of said individual circuits and a plurality of said circular copper-plated parapets, wherein the circuits are separated from each other, and each said individual circuit is circled by one said circular copper-plated parapet, in which the circular copper-plated parapet and the individual circuit are separated from each other;

(3) evening: evening the surface of the ceramic base carrying the dry film, the individual circuits, and the circular copper-plated parapets; and (4) electroplating for thickening: repeatedly performing dry film application, exposure, development, and copper platting to the evened ceramic base, so as to make the circular copper-plated parapets around the individual circuits have a desired height, thereby forming copper-plated dams, wherein the copper-plated dams and the ceramic base jointly define package chambers and from an integrated structure.

As a preferred scheme, in Step (1), performing thin film metallization on the surface of the ceramic board is achieved using magnetron sputtering or vacuum evaporation.

As a preferred scheme, the method further comprises the following steps:

(5) film stripping and etching: using film stripping and etching process to obtain said individual circuits and said copper-plated dams that are separated from each other on the ceramic base; and (6) performing surface treatment: performing immersion gold or immersion silver surface treatment on the individual circuits and copper-plated dams on the ceramic base.

As a preferred scheme, the individual circuits and the circular copper-plated parapets are made on upper and lower surfaces of the ceramic board through performing thin film metallization, applying dry film, performing exposure and development, and plating copper, and vias are provided between the individual circuits on the upper and lower surfaces of the ceramic board for vertical electric connection, in which the vias are filled with metal and the ceramic board, the individual circuits, and the circular copper-plated parapets from the ceramic base.

As a preferred scheme, the circular copper-plated parapets circle the individual circuits on an upper surface of the ceramic base, respectively, and are separated from the individual circuits.

As a preferred scheme, the copper-plated dams are formed by applying dry film, performing exposure and development, and plating the ceramic base once again, so as to thicken only the circular copper-plated parapets.

As a preferred scheme, the copper-plated dam has a height of 0.1 mm-1 mm.

As compared to the prior art, the present invention has significant advantages and beneficial effects. Particularly, from the technical schemes we can have the following understanding.

The present invention makes a circuit layer on a ceramic base by performing thin film metallization, applying dry film, performing exposure and development, plating copper, and evening, and forms copper-plated dams that circle individual circuits by repeatedly applying dry film, performing exposure and development, and performing electroplating thickening, so as to obtain the ceramic package substrate with the copper-plated dam. Circuits made using the method feature for high dimensional precision, high line resolution, and high surface evenness. The vias connecting the circuit layers are fully filled using copper plating, and provide high reliability. The circular copper-plated parapets are thickened through repeated electroplating thereby forming copper-plated dams. The copper-plated dams and the ceramic base are integratedly formed, so as to eliminate the risk of generation of air bubbles and provide firm binding, high reliability, good airtightness. Besides, the process is easy to control and provides good product consistency.

The invention as well as a preferred mode of use, further objectives and advantages thereof will be best understood by reference to the following detailed description of illustrative embodiments when read in conjunction with the accompanying drawings.

DETAILED DESCRIPTION OF THE INVENTION

The present invention discloses a method for preparing a ceramic package substrate with a copper-plated dam. The method comprises the following steps.

(1) Performing thin film metallization: Thin film metallization is performed on the surface of a ceramic board 11. In the present embodiment, thin film metallization on the surface of the ceramic board 11 is performed using magnetron sputtering or vacuum evaporation.

Figure 1:
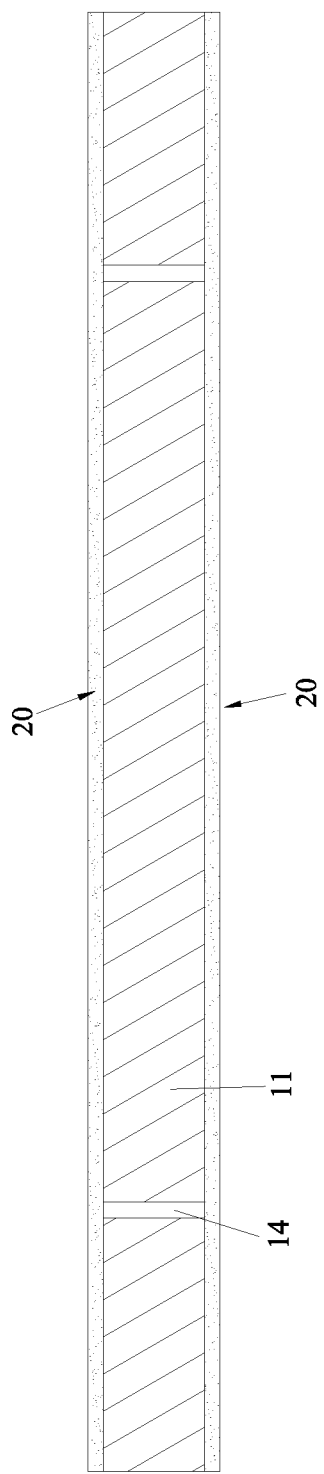
FIG. 1 is a cross-sectional view of a substrate in process according to a preferred embodiment of the present invention, showing a first in-process state of the substrate.
Figure 2:
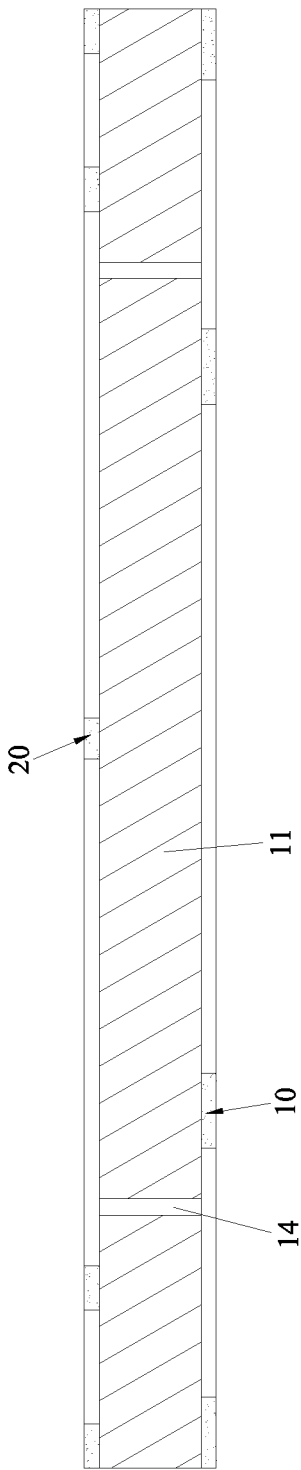
FIG. 2 is a cross-sectional view of the substrate in its second in-process state.
Figure 3:
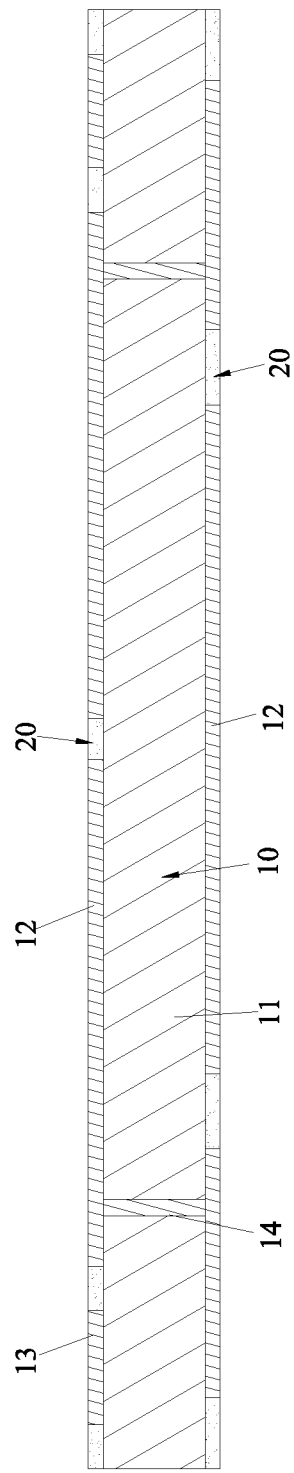
FIG. 3 is a cross-sectional view of the substrate in its third in-process state.

(2) Making individual circuits 12 and circular copper-plated parapets 13 on the ceramic base 10: This step involves applying dry film, performing exposure and development, and plating copper on the metalized surface of the ceramic board 11 successively, so as to obtain a ceramic base 10 carrying a plurality of said individual circuits 12 and the circular copper-plated parapets 13, wherein the circuits 12 are separated from each other, and each said individual circuit 12 is circled by one said circular copper-plated parapet 13. The circular copper-plated parapet 13 and the individual circuit 12 are separated from each other. FIG. 1 is an enlarged cross-sectional view of the ceramic board 11 applied with the dry film 20. FIG. 2 is an enlarged cross-sectional view of the ceramic base 10 after exposure and development. FIG. 3 is an enlarged cross-sectional view of the ceramic base 10 after copper plating. In the present embodiment, the individual circuits 12 and the circular copper-plated parapet 13 are made on the upper and lower surfaces of the ceramic board 11 through thin film metallization, dry film application, exposure, development, and copper plating. Between individual circuits 12 on the upper and lower surfaces of the ceramic board 11, there are vias 14 for enabling vertical electric connection. These vias 14 are filled with metal. The ceramic board 11, the individual circuits 12, and the circular copper-plated parapets 13 form the ceramic base 10. The circular copper-plated parapets 13 each circle an individual circuit 12 on the upper surface of the ceramic base 10 and are separated from the individual circuits 12.

(3) Evening: The ceramic base 10 carrying the dry film 20, the individual circuits 12 and the circular copper-plated parapet 13 are evened at its surface using, for example, an abrasive band.

Figure 4:
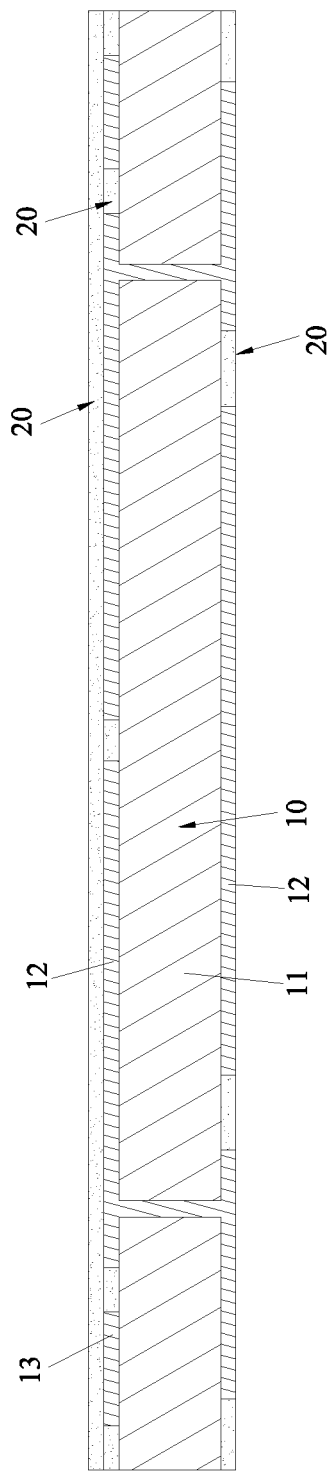
FIG. 4 is a cross-sectional view of the substrate in its fourth in-process state.
Figure 5:
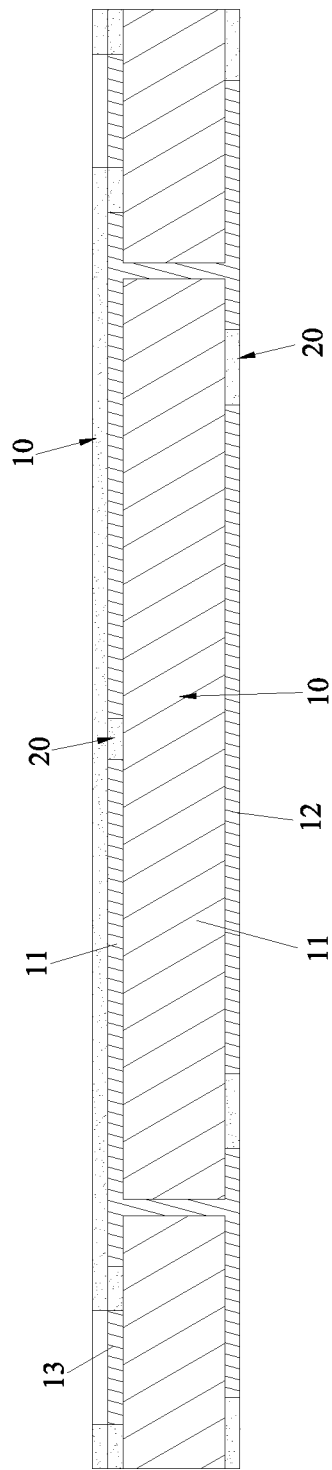
FIG. 5 is a cross-sectional view of the substrate in its fifth in-process state.
Figure 6:
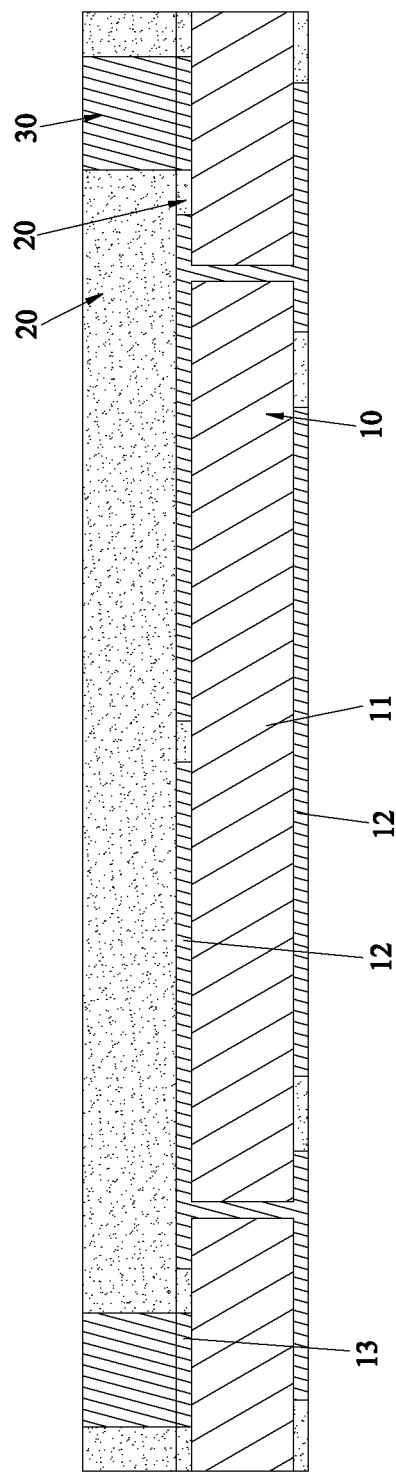
FIG. 6 is a cross-sectional view of the substrate in its sixth in-process state.

(4) Electroplating for thickening: Applying dry film 20, performing exposure and development, plating copper are performed repeatedly on the evened ceramic base 10, so that the circular copper-plated parapets 13 around the individual circuits 12 are thicken to a desired height through electroplating, thereby forming copper-plated dams 30. The copper-plated dams 30 and the ceramic base 10 jointly define package chambers 101 and form an integrated structure. FIG. 4 is an enlarged cross-sectional view of the ceramic base 10 applied with the dry film 20. FIG. 5 is an enlarged cross-sectional view of the ceramic base 10 after exposure and development. FIG. 6 is an enlarged cross-sectional view of the ceramic base 10 after at least one round of repeated application of dry film 20, exposure, development, and copper plating. In the present embodiment, the copper-plated dams 30 is made by only thickening the circular copper-plated parapets 13 which is achieved by performing dry film application, exposure, development, and electroplating on the ceramic base 10 once again. The copper-plated dam 30 has a height of 0.1 mm-1 mm.

The method further comprises the following steps.

Figure 7:
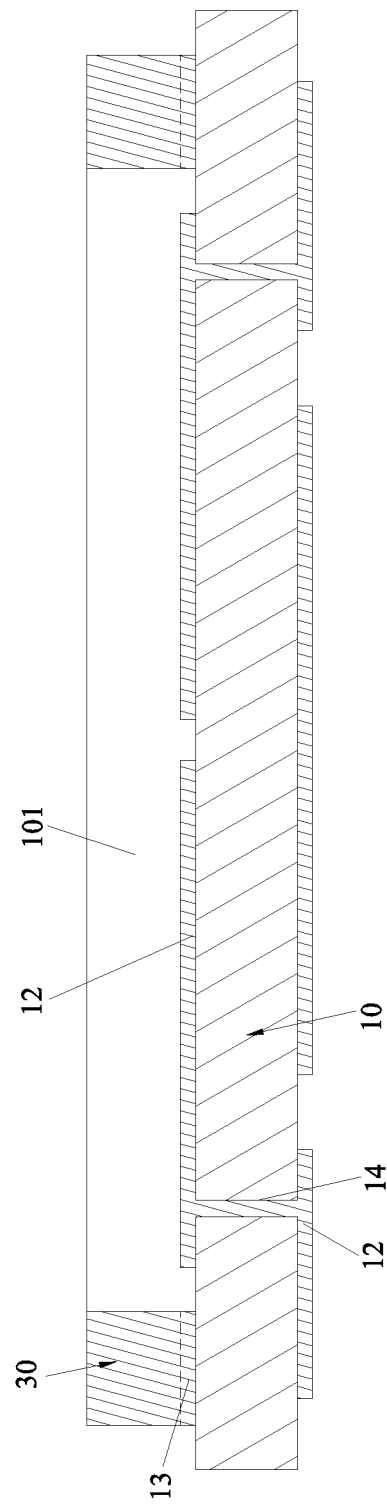
FIG. 7 is a cross-sectional view of the substrate in its seventh in-process state.
Figure 8:
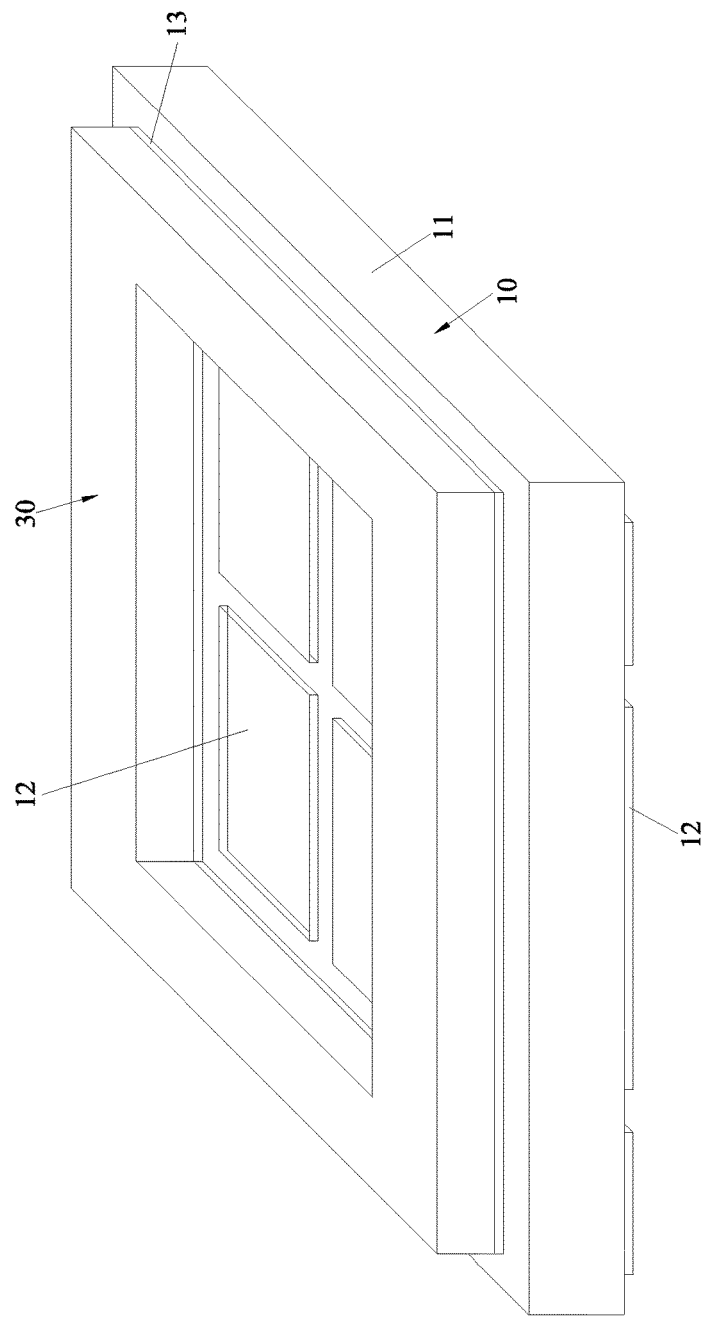
FIG. 8 is a perspective view of the finalized individual substrate according to the preferred embodiment of the present invention.
Figure 9:
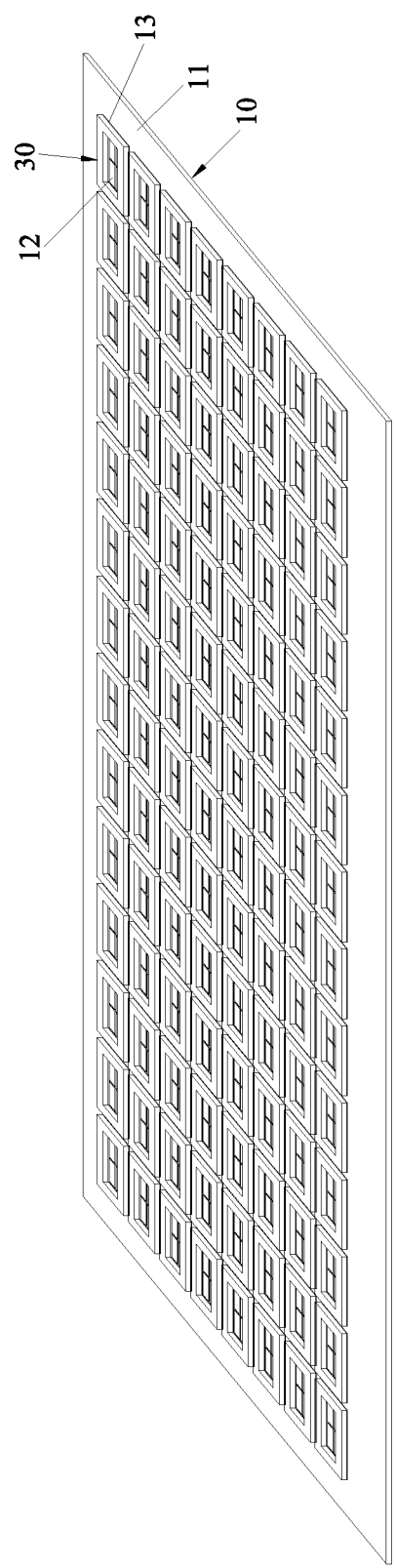
FIG. 9 is a schematic drawing showing a panel of substrates according to the preferred embodiment of the present invention.

(5) Film stripping and etching: as shown in FIG. 7 through FIG. 9, through film stripping and etching processes, individual circuits 12 and copper-plated dams 30 are made on the ceramic base 10 and separated from each other.

(6) Performing surface treatment: this step provides immersion gold or immersion silver surface treatment to the individual circuits 12 and the copper-plated dams 30 on the ceramic base 10.

The products made using the disclosed method have been tested for reliability and airtightness using known testing protocols, which are not discussed in detail herein. As proven in the tests, the products satisfy the US military standard MIL-STD-883 in terms of reliability, and have leakage smaller than 5.9×10-9 Pa·m3/s in terms of airtightness, achieving a superior rank.

The point of the present invention is that the present invention makes a circuit layer on a ceramic base by performing thin film metallization, applying dry film, performing exposure and development, plating copper, and evening, and forms copper-plated dams that circle individual circuits by repeatedly applying dry film, performing exposure and development, and performing electroplating thickening, so as to obtain the ceramic package substrate with the copper-plated dam. Circuits made using the method feature for high dimensional precision, high line resolution, and high surface evenness. The vias connecting the circuit layers are fully filled using copper plating, and provide high reliability. The circular copper-plated parapets are thickened through repeated electroplating thereby forming copper-plated dams. The copper-plated dams and the ceramic base are integratedly formed, so as to eliminate the risk of generation of air bubbles and provide firm binding, high reliability, good airtightness. Besides, the process is easy to control and provides good product consistency.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A method for preparing a ceramic package substrate with a copper-plated dam, comprising the following steps:
    (1) performing thin film metallization: performing thin film metallization on a surface of a ceramic board;
    (2) making individual circuits and circular copper-plated parapets on a ceramic base: performing dry film application, exposure, development, and copper plating successively on the metalized surface of the ceramic board, so as to obtain a ceramic base carrying a plurality of said individual circuits and the circular copper-plated parapet, wherein the circuits are separated from each other, and each said individual circuit is circled by one said circular copper-plated parapet, in which the circular copper-plated parapet and the individual circuit are separated from each other;
    (3) evening: evening the surface of the ceramic base carrying the dry film, the individual circuits, and the circular copper-plated parapets; and
    (4) electroplating for thickening: repeatedly performing dry film application, exposure, development, and copper platting to the evened ceramic base, so as to make the circular copper-plated parapets around the individual circuits have a desired height, thereby forming copper-plated dams, wherein the copper-plated dams and the ceramic base jointly define package chambers and from an integrated structure.

2. The method of claim 1, wherein in Step (1), performing thin film metallization on the surface of the ceramic board is achieved using magnetron sputtering or vacuum evaporation.

3. The method of claim 1, further comprising the following steps:
    (5) film stripping and etching: using film stripping and etching process to obtain said individual circuits and said copper-plated dams that are separated from each other on the ceramic base;
    (6) performing surface treatment: performing immersion gold or immersion silver surface treatment on the individual circuits and copper-plated dams on the ceramic base.

4. The method of claim 1, wherein the individual circuits and the circular copper-plated parapets are made on upper and lower surfaces of the ceramic board through performing thin film metallization, applying dry film, performing exposure and development, and plating copper, and vias are provided between the individual circuits on the upper and lower surfaces of the ceramic board for vertical electric connection, in which the vias are filled with metal and the ceramic board, the individual circuits, and the circular copper-plated parapets from the ceramic base.

5. The method of claim 1, wherein the circular copper-plated parapets circle the individual circuits on an upper surface of the ceramic base, respectively, and are separated from the individual circuits.

6. The method of claim 1, wherein the copper-plated dams are formed by applying dry film, performing exposure and development, and plating the ceramic base once again, so as to thicken only the circular copper-plated parapets.

7. The method of claim 1, wherein the copper-plated dam has a height of 0.1 mm-1 mm.

* * * * *